Nov. 24, 1970 B. H. PINCKAERS 3,543,176

SEMICONDUCTOR DIFFERENTIAL AMPLIFIER

Original Filed Sept. 27, 1965

INVENTOR.
BALTHASAR HUBERT PINCKAERS

BY *Omund R. Dahle*

ATTORNEY

United States Patent Office 3,543,176

Patented Nov. 24, 1970

3,543,176

SEMICONDUCTOR DIFFERENTIAL AMPLIFIER

Balthasar Hubert Pinckaers, Edina, Minn., assignor to Honeywell Inc., Minneapolis, Minn., a corporation of Delaware Continuation of application Ser. No. 490,550, Sept. 27, 1965. This application Mar. 12, 1969, Ser. No. 806,786

Int. Cl. H03f 3/68

U.S. Cl. 330—30 6 Claims

ABSTRACT OF THE DISCLOSURE

A solid-state differential amplifier apparatus which has a high current gain and which provides at its output circuit a high impedance so that the output load current is substantially independent of the magnitude of the attached load circuit.

This application is a continuation of copending application Ser. No. 490,550, now abandoned.

My invention relates to a new and improved differential amplifier apparatus which has a high current gain and also which provides a high impedance output circuit so that the output load current is substantially independent of the magnitude of the load impedance connected to the output circuit of the differential amplifier.

Figure 1:
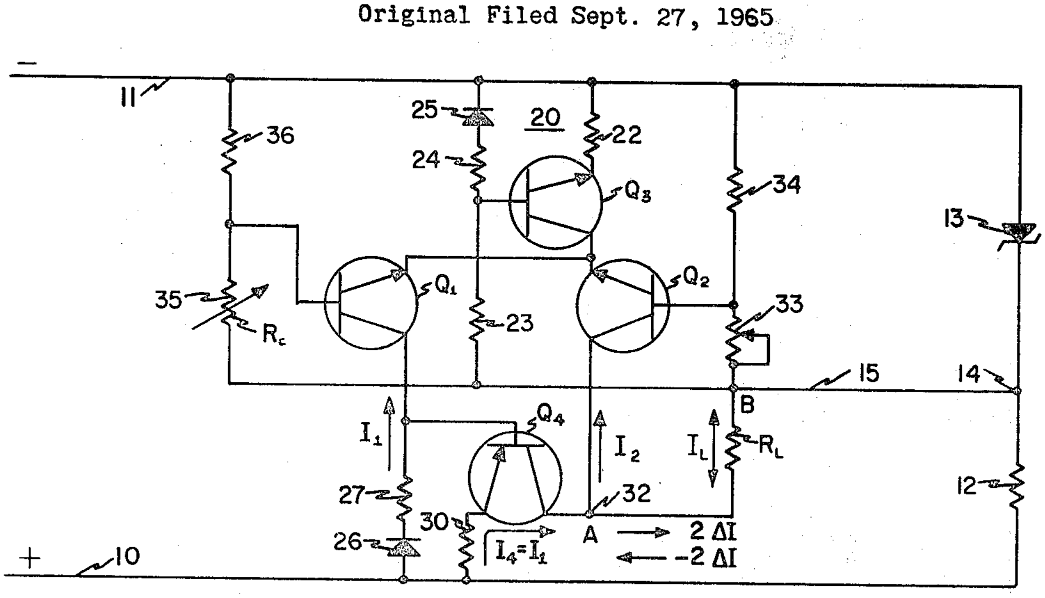
FIG. 1 is a schematic representation of one embodiment of my invention.

Turning now to FIG. 1 there is disclosed a pair of power input conductors 10 and 11 which are adapted to be connected to a D.C. potential source, such as a battery, not shown. The positive line conductor 10 is connected through a resistor 12 and a Zener reference diode 13 to the negative conductor 11. The junction 14 between the resistor 12 and diode 13 connects to a reference condu-tor or bus 15. A pair of matched semiconductor current controlling means, here shown as NPN transistors Q1 and Q2, form the basic part of the differential amplifier, these transistors having base, emitter and collector electrodes. They may be of the type in which the two matched units are mounted in a single can, if desired.

The emitter electrodes of transistors Q1 and Q2 are directly connected together and are further connected to a constant current source generally shown as 20. This constant current source includes a third transistor Q3 having a collector electrode to which the emitter electrodes of transistor Q1 and Q2 are directly connected. The emitter electrode of transistor Q3 is connected through an emitter resistor 22 to the negative conductor 11. A bias supply for the base electrode of current regulator Q3 consists of a voltage divider comprising series connected resistors 23 and 24 and a compensating diode 24 which are connected between conductors 15 and 11. The diode 25 provides temperature compensation for the base-emitter junction of transistor Q3. The positive source conductor 10 is applied to the collector of transistor Q1 by a series circuit including a compensating diode 26 and a collector load resistor 27. A similar circuit exists from the positive conductor 10 through a load resistor 30, the emitter-collector electrodes of a PNP transistor Q4, and output terminal 32 to the collector electrodes of transistor Q2. The value of resistor 30 is preferably chosen to be the same as resistor 27. The base electrode of transistor Q4 is directly connected to the junction between resistor 27 and the collector electrode of transistor Q1. An output circuit represented by resistive element $R_L$ is connected between the output terminal 32 and the reference conductor 15.

A bias circuit is connected to the base of transistor Q2 including a resistor element 33, a portion of which may be an adjustable resistance, the resistive means 33 being connected between the reference conductor 15 and the Q2 base electrode. This base electrode is also connected through a resistive element 34 to the negative conductor 11. The transistor Q1 is biased by a resistive element 36 connected between the base electrode and negative conductor 11, and also by a condition responsive impedance element 35, which may be a temperature responsive resistor, for example, connected between the reference conductor 15 and the Q1 transistor base electrode to provide a signal to the differential amplifier at the base electrodes of Q1 and Q2.

Turning now to the operation of FIG. 1, it will be apparent that the emitter currents of transistor Q1 and Q2 are summed together and flow through the current limiting transistor Q3, so that the sum of the emitter currents from transistors Q1 and Q2 does not vary. The collector current for transistor Q1 flows from conductor 10 through the diode 26 and the collector load resistor 27 to the collector electrode. The potential drop appearing across the diode 26 and resistor 27 is applied as a turn on bias for the PNP transistor Q4. Since the resistors 27 and 30 are of equal values and since the diode 26 compensates for the emitter-base diode potential drop of transistor Q4, the same current flows out of the collector circuit of Q4 as flows through resistor 27 and transistor Q1.

Under balanced conditions the current $I_1$ flowing through transistor Q1 and the current $I_2$ flowing through transistor Q2 may be chosen to be equal in value. The resistors 33, 34, 35 and 36 form a bridge circuit which applies a signal to the base electrodes of transistors Q1 and Q2 and thus a balanced condition may be achieved by a proper adjustment of the bridge such as for example, by the adjustment of variable resistance 33. As the condition sensed by condition responsive element 35 changes, the impedance thereof increases or decreases in response to the condition, so that a changed signal is applied to the differential amplifier resulting in a change in the conduction of the two transistors. Thus, a decrease in the value of resistance of element 35 causes an increase in the value of the current $I_1$ and an equal decrease in the value of current $I_2$. The increase in current $I_1$ results in a larger potential drop across the collector load resistor 27 which causes the collector current of $I_4$ of transistor Q4 to increase in conduction by an equal amount. Under balanced conditions the current $I_1=I_2=I_4$ and under all conditions $I_4=I_1$. If we assume the signal caused an increase in $I_1$ to a value of $I_1+\Delta I$, then the current through Q2 has reduced to a value of $I_2-\Delta I$ and the current through transistor Q4 has increased to a value of $I_1+\Delta I$. The load current flowing from output terminal 32 to conductor 15 is $2\Delta I$. Transistors Q2 and Q4 provide a high impedance to the output circuit so that the output current is substantially independent of the value of the load resistance. In other words, the load current $2\Delta I$ will flow through the load over a wide range of load impedance magnitude.

When the condition reverses so that the current flowing through transistor Q1 becomes $I_1-\Delta I$, the current flowing through transistor Q2 will increase by an equal amount so that it will equal $I_2+\Delta I$ and the current flowing in transistor Q4 will reduce to a value of $I_1-\Delta I$. Under these conditions the load current will reverse in direction and a current of $-2\Delta I$ will flow from the conductor 15 to the output terminal 32.

Figure 2:
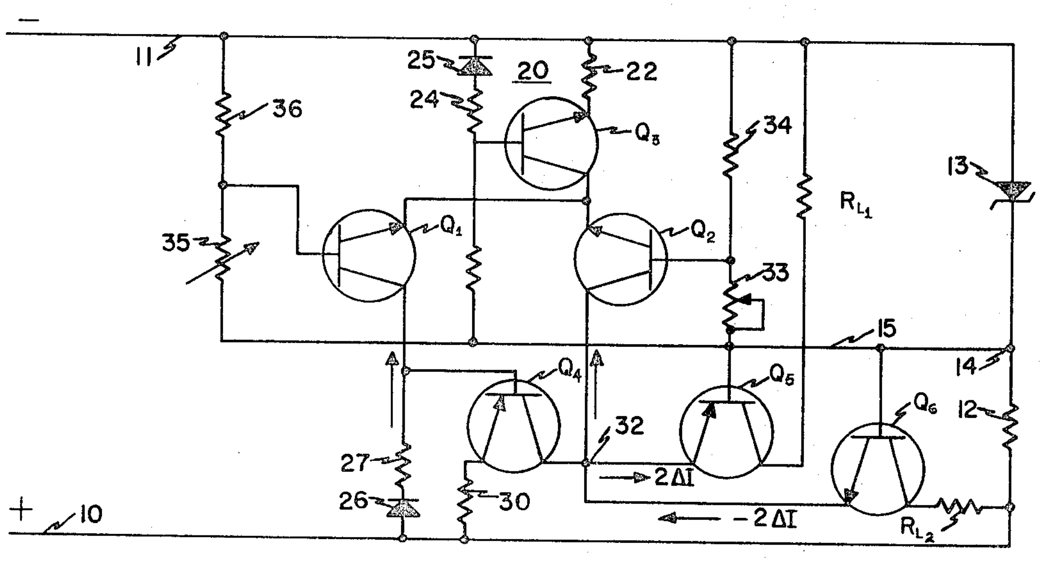
FIG. 2 is a modification of FIG. 1.
Figure 3:
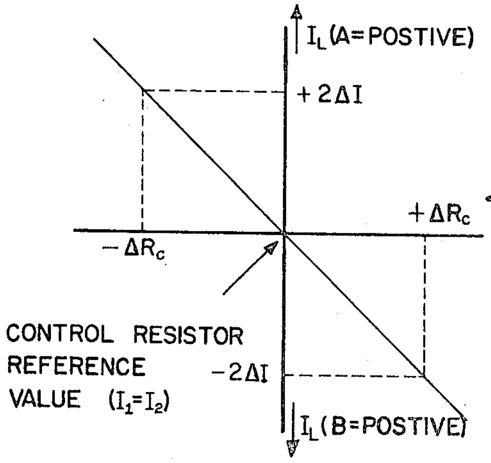
FIG. 3 is a graphical representation of certain operating parameters of the invention.

In the modification shown in FIG. 2, the invention includes a discriminator output circuit comprising two additional complementary transistors. FIG. 2 is substantially the same as FIG. 1 except that output terminal 32 is connected to the emitter electrode of a PNP transistor Q5 and also to the emitter electrode of a NPN transistor Q6. The base electrodes of these two discriminator transistors are connected to the conductor 15. The collector electrode of transistor Q5 is connected through a load device $R_{L_1}$ to the negative conductor 11 providing a power gain and the collector of transistor Q6 is connected through a load impedance device $R_{L_2}$ to the positive conductor 10. When the signal is such that $I_1$ increases and $I_2$ decreases a current of $2\Delta I$ flows through the transistor Q5 and energizes the load device $R_{L_1}$. When the situation reverses discriminating transistor Q6 carries the reversed output current of $-2\Delta I$ to energize second load device $R_{L_2}$.

The embodiments of the invention in which an exclusive property or right is claimed are defined as follows:

I claim:

1. Differential amplifier apparatus comprising:

a unidirectional source of current having first and second terminals;

first, second and third transistor means, each having emitter and collector electrodes and a control electrode;

conductive means connecting the emitter electrode of said first and second transistor means to said first source terminal;

first resistive means having one terminal thereof conductively connected to the collector electrode of said first transistor means and having the second terminal thereof connected to said second source terminal;

connecting means connecting the control electrode of said third transistor means to said one terminal of said first resistive means;

a series circuit comprising second resistive means and the emitter and collector electrodes of said third transistor means, said series circuit connecting said second source terminal to the collector electrode of said second transistor means, said series circuit being arranged so that said resistive means is between said second source terminal and said emitter electrode, said collector electrodes of said second and third transistor means being connected together;

an output terminal connected to the collector electrodes of said second and third transistor means;

load means connected from said output terminal to a reference potential terminal intermediate said first and second source terminals;

and signal means having a pair of input terminals connected to said reference potential terminal and to said first source terminal, respectively, and having output terminals connected to the control electrodes of said first and second transistor means.

2. Apparatus as defined in claim 1 in which the first and second transistors are of the NPN type and the third transistor is of the PNP type.

3. Apparatus as defined in claim 1 in which said signal means comprises a condition responsive bridge circuit.

4. Apparatus as defined in claim 3 in which said condition responsive bridge circuit comprises a temperature responsive bridge.

5. Apparatus as defined in claim 1 in which said first resistive means comprises in series a resistor and a semiconductor diode for temperature compensating said third semiconductor current controlling means.

6. Apparatus as defined in claim 1 in which said load means comprises a PNP transistor and a NPN transistor, each transistor having its emitter electrode connected to said output terminal and having its base electrode connected to said intermediate terminal.

References Cited

UNITED STATES PATENTS 3,261,988 7/1966 Johnson ---------- 330—69 X

ROY LAKE, Primary Examiner

LAWRENCE J. DAHL, Assistant Examiner

U.S. Cl. X.R.

330—17, 23